United States Patent [19]

Scifres et al.

[11] Patent Number: 5,048,036
[45] Date of Patent: Sep. 10, 1991

[54] HETEROSTRUCTURE LASER WITH LATTICE MISMATCH

[75] Inventors: Donald R. Scifres; David F. Welch, both of San Jose; John Endriz, Belmont, all of Calif.; William Streifer, deceased, late of Palo Alto, Calif., by Shirley Streifer, Executrix

[73] Assignee: Spectra Diode Laboratories, Inc., San Jose, Calif.

[21] Appl. No.: 638,358

[22] Filed: Jan. 4, 1991

Related U.S. Application Data

[63] Continuation-in-part of Ser. No. 408,675, Sep. 18, 1989, Pat. No. 4,984,242.

[51] Int. Cl.$^5$ .......................... H01S 3/19; H01L 33/00
[52] U.S. Cl. ............................................ 372/45; 357/4; 357/16; 357/17
[58] Field of Search .................. 372/45, 44, 43; 357/4, 357/16, 17

[56] References Cited

U.S. PATENT DOCUMENTS

| | | | |
|---|---|---|---|
| 4,573,161 | 2/1986 | Sakai et al. | 372/45 |
| 4,611,328 | 9/1986 | Liu et al. | 372/45 |
| 4,661,961 | 4/1987 | Nelson et al. | 372/46 |
| 4,712,219 | 12/1987 | Yano et al. | 372/45 |
| 4,737,960 | 4/1988 | Tsang | 372/45 |
| 4,740,977 | 4/1988 | Ikeda | 372/45 |
| 4,769,821 | 9/1988 | Gotoh | 372/45 |
| 4,860,297 | 8/1989 | Hayakawa et al. | 372/45 |

OTHER PUBLICATIONS

W. T. Tsang, "Extension of Lasing Wavelengths Beyond 0.87 μm in GaAs/Al$_x$Ga$_{1-x}$As Double-Heterostructure Lasers by In Incorporation in the GaAs Active Layers During Molecular Beam Epitaxy," *Applied Physics Letters,* 38(9), May 1, 1981, pp. 661–663.

G. C. Osbourn, "Strained-Layer Superlattices: A Brief Review," *IEEE Journal of Quantum Electronics,* vol. QE-22, No. 9, Sep. 1986, pp. 1677–1681.

S. E. Fischer et al., "Long-Lived InGaAs Quantum Well Lasers," *Applied Physics Letters,* 54 (19), May 8, 1989, pp. 1861–1862.

W. Walukiewicz, "Dislocation Density Reduction by Isoelectronic Impurities in Semiconductors," *Applied Physics Letters,* 54 (20), May 15, 1989, pp. 2009–2011.

G. C. Osbourn et al., "A GaAs$_x$P$_{1-x}$/GaP Strained-Layer Superlattice," *Applied Physics Letters,* 41 (2), Jul. 15, 1982, pp. 172–174.

I. J. Fritz et al., "Dependence of Critical Layer Thickness on Strain for In$_x$Ga$_{1-x}$As/GaAs Strained-Layer Superlattices," *Applied Physics Letters,* 46 (10), May 15, 1985, pp. 967–969.

C. Shieh et al., "Critical Thickness in Strained-Layer GaInAs/GaAs Quantum Well Lasers," *Electronics Letters,* vol. 25, No. 18, Aug. 31, 1989, pp. 1226–1228.

K. J. Beernink et al., "Dependence of Threshold Current Density on Quantum Well Composition for Strained-Layer InGaAs-GaAs Lasers by Metalorganic Chemical Vapor Deposition," *Applied Physics Letters,* 55 (25), Dec. 18, 1989, pp. 2585–2587.

*Primary Examiner*—Georgia Epps
*Attorney, Agent, or Firm*—Schneck & McHugh

[57] ABSTRACT

Semiconductor heterostructure lasers having at least one lattice mismatched strain layer in the cladding proximate to the active region. Indium or phosphorus may be added in high concentration to form the strain layers. The strain layers may be spaced somewhat apart from the active region or may be adjacent to the active region. In either case, the strain layers decrease transparency current and increase differential gain.

37 Claims, 1 Drawing Sheet

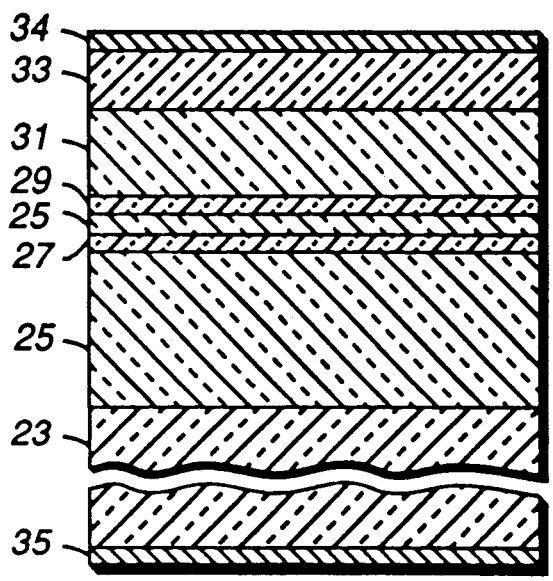
FIG._1
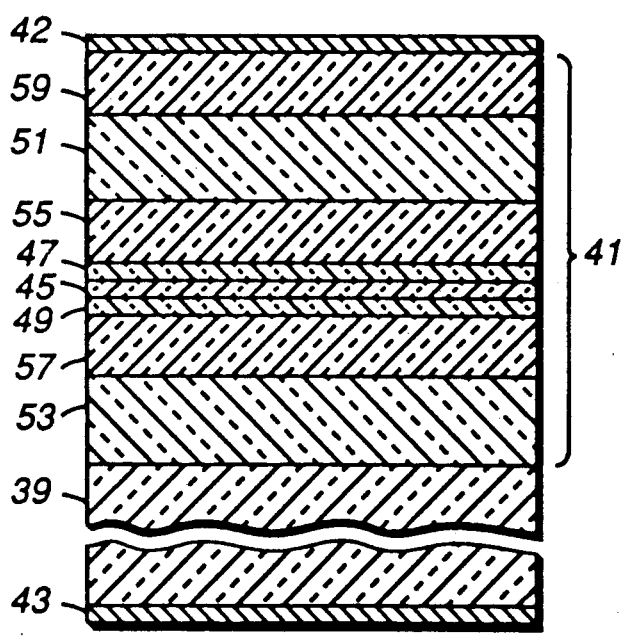
FIG._2
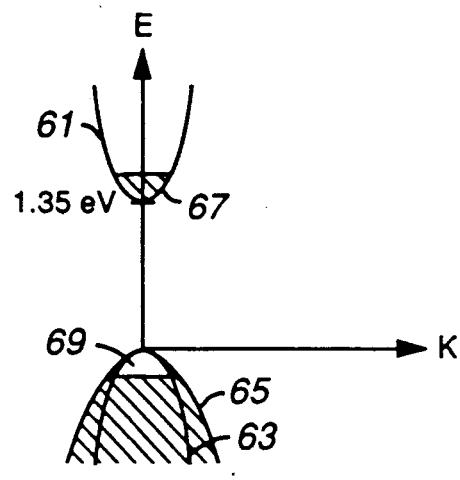
FIG._3A
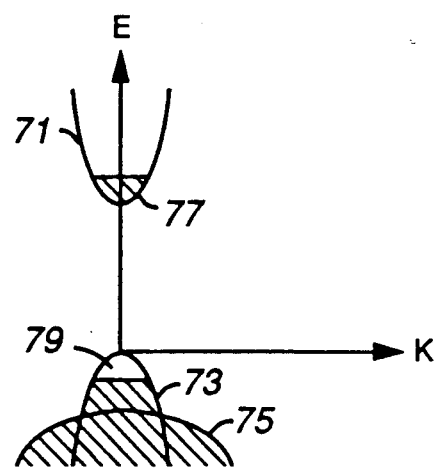
FIG._3B

HETEROSTRUCTURE LASER WITH LATTICE MISMATCH

DESCRIPTION

Cross Reference to Related Application

This is a continuation-in-part of application Ser. No. 07/408,675, filed Sept. 18, 1989, now U.S. Pat. No. 4,984,242.

Technical Field

The present invention relates to semiconductor diode lasers, such as semiconductor heterostructure lasers, and in particular relates to lasers in which lattice strain has been adjusted to bring about improved performance or improved reliability.

Background Art

Strained quantum well active regions are currently of interest for extending the laser emission wavelengths of various material systems. W. T. Tsang, in *Applied Physics Letters* 38(9), May 1, 1981, pp. 661-663, describes a GaAs/AlGaAs heterostructure laser having an InGaAs active layer. The indium was incorporated into the active layer in order to increase the output wavelength up to 0.94 μm. The article also notes that a wavelength extension to 0.88 μm can be accomplished without significant increase in the threshold current of the laser if the aluminum content of the cladding layers is such that cladding and active layers are exactly lattice matched. Other embodiments described have built-in layer strain due to lattice mismatch, because InGaAs has a larger lattice constant, when the indium content is greater than 2%, than either GaAs or AlGaAs.

One would expect the strain to cause degradation of a laser, with a resulting short lifetime and a significant probability of sudden failure. And, in fact, if a mismatched layer is grown too thick, cracking and other permanent dislocations can result. G. C. Osbourn, in *IEEE Journal of Quantum Electronics*, vol. QE-22, no. 9, Sept., 1986, pp. 1677-1681, describes properties of semiconductor superlattices and quantum-well structures that have mismatched lattices. All the lattice mismatch is accommodated by layer strain without the generation of dislocations if the individual layers are below certain critical thicknesses. The critical thicknesses depend on the amount of lattice mismatch between layers and on the elastic properties of the layer materials. Further, the article notes that it has been observed that strained-layer superstructures tend to act as barriers against dislocation propagation.

Recently, strained layer lasers with InGaAs active layers have been demonstrated to have long life and relatively good reliability despite the built-in strain. S. E. Fischer, et al., in *Applied Physics Letters*, 54(19), May 8, 1989, pp. 1861-1862, report the 5000 hour CW operation of lasers with a single $In_{0.37}Ga_{0.63}As$ quantum well in a GaAs/AlGaAs heterostructure. No sudden failures were observed.

Osbourn, in the above-cited article, also discusses some electronic properties of semiconductor materials caused by layer strain. In particular, strain changes the band structure of the material. Bulk energy levels are shifted causing an increase or decrease in the band gap. Certain band degeneracies are split as the bands are distorted by the strain, causing changes in effective hole masses and shifting energy levels. As a result of this, an increase in the gain coefficient and a decrease in the transparency current have been observed in lasers with strained quantum well active regions.

In U.S. Pat. No. 4,712,219, Yano et al. describe a heterostructure laser having an active layer composed of InGaP formed between cladding layers of InAlP. The heterostructure is formed on a GaAs substrate with a graded layer between the substrate and lower cladding layer. The graded layer, which may be composed of InGaAs, InAlP, InAlAs, InAlSb or InGaSb, has a composition that varies from the substrate to the cladding layer so as to result in an approximate coincidence of lattice constants between the graded layer and the cladding layer. The cladding and active layers are lattice matched.

In U.S. Pat. No. 4,769,821, Gotoh describes a GaAs/AlGaAs heterostructure laser having window regions adjacent to the mirror surfaces for higher output power. The window regions are formed by surrounding the heterostructure cladding and active layers with InGaP layers at the laser ends. Because of InGaP's smaller lattice constant, these additional layers apply stress to the active layer, thereby increasing the band gap and reducing absorbance in the end regions.

W. Walukiewicz, in *Applied Physics Letters* 54(20), May 15, 1989, pp. 2009-2011, describes the reduction of dislocation density in a compound semiconductor lattice by isoelectronic doping. Strain introduced locally by randomly distributed dopants lowers the vacancy supersaturation, thereby impeding dislocation formation via vacancy condensation. For GaAs, doping with indium to a concentration of $5 \times 10^{19}$ cm$^{-3}$ reduces supersaturation below the critical value for dislocation formation.

In U.S. Pat. No. 4,661,961, Nelson et al. describe an InP laser having an InGaAsP or InGaAs cap layer. These cap layers are described as having low contact resistance for facilitating contact with an electrode. Also, in *Applied Physics Letters* 53, p. 900 (1988) an $In_{0.53}Ga_{0.47}As$ ohmic contact to Pt/Ti was shown to have low resistance.

An object of the invention was to provide improved semiconductor heterostructure lasers with increased differential gain and with reduced degradation rate.

DISCLOSURE OF THE INVENTION

The above object has been met with a semiconductor laser having a multilayer semiconductor heterostructure disposed on a substrate, wherein at least one cladding layer of the heterostructure, other than or in addition to an active region, has a strain inducing lattice mismatched composition. While the prior art incorporates indium into the active region to produce strain, Applicant has recognized that strain can also be introduced into the active region by changing the stoichiometry of any cladding layer in close proximity to the quantum well active region. Accordingly, the invention has one or more strain layers on at least one side of a quantum well active region. Either or both cladding layers may have these strain layers, and the strain layers can be either adjacent to or somewhat spaced apart from the active region. The strain layers can also be patterned to produce a plurality of spaced apart laser emitters. The strain layers increase laser gain, thereby improving efficiency.

BRIEF DESCRIPTION OF THE DRAWINGS

FIG. 1 is a side section of a first semiconductor laser embodiment of the present invention having strain layers in the cladding.

FIG. 2 is a side section of a second semiconductor laser embodiment of the present invention having strain layers bounding the active region.

FIGS. 3A and 3B are graphs of band energy E versus wave number k illustrating the effect of the strain layers in the embodiment of FIG. 2.

BEST MODE FOR CARRYING OUT THE INVENTION

With reference to FIG. 1, a first semiconductor laser of the present invention comprises a substrate 23, a first cladding layer 25 disposed above the substrate 23, a strain layer 27 formed in cladding layer 25, an active region 29 disposed on cladding layer 25, a second cladding layer 31 disposed on active region 29, a cap layer 33 disposed above second cladding layer 31, and metallization layers 34 and 35 disposed on cap layer 33 and a bottom surface of substrate 23 respectively. A graded buffer layer, not shown, could also be added between substrate 23 and first cladding layer 25. Active region 29 may consist of a single quantum well layer or, alternatively, of multiple quantum wells separated by thin barrier layers.

Any of a number of different semiconductor material compositions may be used for the various layers to provide a laser heterostructure. For example, the substrate 23 may be n-GaAs, the cladding layers 25 and 31 may be n-GaAlAs and p-GaAlAs, respectively, active region quantum wells may be GaAs and cap layer 33 may be p-GaAs. Alternatively, substrate 23 may be composed of n-InP. Substrate 23 might even be composed of some other III-V semiconductor material, such as GaAlAs, GaAlAsP, GaAsP, GaP, GaSb, InSb, or InGaAsP. Cladding layers 25 and 31 may be n-InGaAsP and p-InGaAsP, respectively, and active region quantum wells may be InP, InGaAs or InGaAsP of lower bandgap and higher refractive index than cladding layers 25 and 31. In general, any III-V semiconductor compound may be used, provided certain conditions, related to carrier confinement, optical waveguiding, and lattice defect generation, are met. In particular, in any single or multiple quantum well active region, the quantum well layers will have a smaller effective bandgap than the thin barrier layers. In all heterostructure lasers, the cladding layers 25 and 31 bounding the active region 29 will have a greater effective bandgap than the active region. These conditions ensure good carrier confinement in the active region 29. The cladding layers 25 and 31 also form a waveguide within the active region. The lattice constants of the heterostructure layer materials should also be, with the exception of the strain layer 27 discussed below, substantially matched with one another in order to minimize the generation of lattice defects, such as dislocations or cracks.

Lattice constants are substantially matched by assuming that the lattice constants of mixed crystals, represented by the formula $In_uGa_vAl_wSb_xAs_yP_z$, where $u+v+w=1$ and $x+y+z=1$, are composites with a linear variation between the lattice constants of their pure crystal constituents AlP, GaP, InP, AlAs, GaAs, InAs, AlSb, GaSb and InSb. The following table provides the lattice constants for the above-named constituents. Band gaps are also provided for reference.

| Material | Lattice constant (in Å) | Band Gap (in eV) |
|---|---|---|
| AlP | 5.451 | 2.5 |
| GaP | 5.4505 | 2.24 |
| InP | 5.86875 | 1.27 |
| AlAs | 5.6622 | 2.16 |
| GaAs | 5.65315 | 1.35 |
| InAs | 6.05838 | 0.36 |
| AlSb | 6.1355 | 1.60 |
| GaSb | 6.0954 | 0.67 |
| InSb | 6.47877 | 0.165 |

EXAMPLE 1

($Ga_{0.6}Al_{0.4}As$)

The lattice constant of $Ga_{0.6}Al_{0.4}As$ is found by assuming a composite of 60% GaAs and 40% AlAs; and linear variation of lattice constant:

$$(0.6)(5.65315 \text{ Å}) + (0.4)(5.6622 \text{ Å}) \approx 5.6568 \text{ Å}$$

EXAMPLE 2

($In_{0.1}Ga_{0.4}Al_{0.5}As$)

Using the same technique for a mix of three composite species, we obtain a lattice constant of:

$$0.1(6.05858 \text{ Å}) + (0.4)(5.66315 \text{ Å}) + (0.5)(5.6622 \text{ Å}) \approx 5.6982 \text{ Å}$$

EXAMPLE 3

($GaAs_{0.8}P_{0.2}$)

The same technique can be used when anions are mixed. Here we assume a composite of 80% GaAs and 20% GaP. The lattice constant is thus:

$$(0.8)(5.65315 \text{ Å}) + (0.2)(5.4505 \text{ Å}) \approx 5.6126 \text{ Å}$$

EXAMPLE 4

($In_{0.1}Ga_{0.9}As_{0.8}P_{0.2}$)

When both cations and anions are mixed, we assume the composite species are proportionate for each ion. Here, we assume a composite of $(0.9)(0.2)=18\%$ GaP, $(0.1)(0.2)=2\%$ InP, $(0.9)(0.8)=72\%$ GaAs and $(0.1)(0.8)=8\%$ InAs. The lattice constant is then:

$$(0.18)(5.4505 \text{ Å}) + (0.02)(5.8675 \text{ Å}) + (0.72)(5.65315 \text{ Å}) + (0.08)(6.05838 \text{ Å}) \approx 5.6534 \text{ Å}.$$

The band structure of mixed crystals is not so clearly predictable from its pure crystal constituents as the lattice constant. However, there are still clear general trends in the band gap as different elemental species are added to or subtracted from a given crystal composition. In general, the band gap increases when lighter ions are substituted for heavier ions, as for example, when aluminum replaces gallium or phosphorus replaces arsenic. The band gap decreases when heavier ions are substituted for lighter ions, as for example, when indium replaces gallium or aluminum.

A principle aspect of this laser embodiment is the presence of a strain layer 27 in cladding layer 25. While the present embodiment shows only a single strain layer 27 in the cladding layer 25 below the active region 29, other strain layers can also be added, especially in the cladding layer 31 above the active region 29. The strain layer 27 is characterized by a lattice constant that differs from the lattice constant of the cladding layer 25 in which it is situated by at least 0.2%. Because strain layer 27 is not lattice matched to cladding layer 25, the lattice distorts and produces a localized strain field.

The lattice constant difference may be provided by adding a selected high concentration of indium to the cladding material to produce the strain layer 27. By a high concentration we mean more than 2%. For example, strain layer 27 could be composed of $In_{0.1}Ga_{0.4}Al_{0.5}As$ in a cladding layer 25 of $Ga_{0.45}Al_{0.55}As$. Alternatively, the lattice constant difference may be provided by adding a selected high concentration of phosphorus to the cladding material to produce the strain layer 27. By a high concentration of phosphorus we mean more than 2%. For example, strain layer 27 could be composed of $GaAs_{0.8}P_{0.2}$ in a cladding layer 25 of $Ga_{0.6}Al_{0.4}As$. Other III-V semiconductor materials compositions could also be used for strain layer 27, using the technique described above to find the respective lattice constants of particular layer compositions, and thus, the amount of lattice mismatch.

The strain layer 27 must be thin, since the mismatched lattice tends to create dislocations if the strain layer is too thick. Accordingly, the strain layer 27 has a thickness which is less than a critical thickness for dislocation generation. Generally, the critical thickness for InAlGaAs or GaAsP strain layers is less than on the order of 100 nm. Strain layer thicknesses on the order of 10 nm are typical. Strain layer 27 is also limited to a lattice mismatch of not more than about 4% if dislocations are to be prevented. Of course, this maximum mismatch amount is also dependent on the thickness of the strained layer.

In FIG. 1, strain layer 27 is in a position spaced somewhat apart from the active region 25. The influence of the localized strain field produced by the strain layer 27 on the active region 25 depends on the degree of lattice mismatch, the thickness of the strain layer and the separation between the nonadjacent strain layer 27 and active region 25. As already noted, the mismatch is on the order of several tenths of a percent or greater, and the strain layer is thinner than a critical thickness. The separation is generally about 20 nm or less for a typical lattice mismatch of 0.75 percent. Greater mismatch will allow greater spacing, while smaller mismatch requires closer spacing.

With reference to FIG. 2, a second semiconductor laser comprises a substrate 39, a multilayer heterostructure 41 disposed on substrate 39, and metallization layers 42 and 43 disposed on top of heterostructure 41 and on a bottom surface of substrate 39, respectively. The multilayer heterostructure 41 includes an active region 45, upper and lower strain layers 47 and 49 bounding active region 45, and cladding layers 51 and 53 above and below strain layers 47 and 49. High band gap, low refractive index confinement layers 55 and 57 may be disposed between strain layer 47 and cladding 51 and between strain layer 49 and cladding 53 for improved carrier confinement and reduced optical losses. A cap layer 59 may be disposed on upper cladding layer 51 for improved metallization contact. Active region 45 may be a single quantum well layer or may consist of multiple quantum wells separated by thin barrier layers. Preferably, the substrate 39 is n-GaAs and heterostructure 41 is a GaAs/GaAlAs heterostructure. Substrate 39 could also be n-InP and the heterostructure 41 could be an InGaAlAsP heterostructure with GaAs, InGaAs, InGaAsP or InP for the active region quantum well layer or layers.

The laser embodiments in FIGS. 1 and 2 are similar in that both include the presence of one or more strain layers 27, 47 and 49. However, whereas the strain layer 27 in FIG. 1 is spaced somewhat away from the active region 29 (typically about 200 Å away), the strain layers 47 and 49 in FIG. 2 are deliberately disposed adjacent to the active region 45. The strain layers 47 and 49 may be composed of $In_uAl_wGa_{1-u-w}As$, where $0.02 \leq u \leq 0.5$ and w is determined such that the bandgap of the strain layers 47 and 49 exceed the bandgap of the active region 45. The strain layers 47 and 49 might instead be composed of $GaAs_{1-z}P_z$, where $z \geq 0.02$. Typically, $z \approx 0.2$. The introduction of indium or phosphorus causes the strain layers 47 and 49 to have a lattice constant that differs from the lattice constant of the layer or layers of the active region 45 by at least 0.2%. Each of the strain layers 47 and 49 and the active region 45 has a thickness which is less than the critical thickness for dislocation generation, i.e. less than 100 nm thick, and which is typically about 10 nm thick. It should be further noted that the strained layers of FIGS. 1 and 2 do not necessarily need to be of a uniform composition across their thickness. A linearly graded composition strained layer could also be used.

The introduction of indium into a strain layer, particularly bounding strain layers 47 and 49 in FIG. 2, requires the simultaneous introduction of aluminum or phosphorus as well, because indium tends to reduce the band gap. The active quantum wells should have lower band gaps than either active region barrier layers, bounding strain layers 47 and 49 and cladding layers 51 and 53 for good current confinement. Aluminum tends to increase the band gap, compensating for the added indium. Phosphorus tends to increase band gap along with its effect on lattice constant, and so would be preferable to indium as a strain producer. Using a combination of elements, as in InGaAlAsP permits both lattice constant and band gap to be somewhat independently adjusted.

With reference to FIGS. 3A and 3B, adding strain to the active region by means of adjacent strain layers changes the band structure from that of an unstrained laser, and improves laser performance. The band structure of an unstrained laser is graphically depicted in FIG. 3A. The band structure includes a conduction band 61 with a minimum energy level of about 1.35 eV for GaAs. The electron effective mass for the conduction band is about $0.067 M_o$, where $M_o$ is the free electron mass. The band structure also includes valence bands 63 and 65. Valence band 63 represents the band for light holes having an effective mass of about $0.12 M_o$, while valence band 65 represents the band for heavy holes having an effective mass of about $0.8 M_o$. The valence bands 63 and 65 are degenerate at the center of the Brillouin zone $\Gamma$, i.e. at $K=0$. Electrically pumping the laser populates the conduction band 61 with electrons 67, leaving holes 69 in both of the valence bands 63 and 65.

By contrast, the band structure of a strained laser, like that shown in FIG. 2, is depicted in FIG. 3B. The stress produced by strain layers 47 and 49 on active region 45 alters the light and heavy hole valence bands 73 and 75, breaking the degeneracy at the $\Gamma$ point $(K=0)$. The energy level of the heavy hole valence band 75 is reduced relative to the light hole valence band 73. Again, electrically pumping the laser populates the conduction band 71 with electrons 77, leaving holes in valence band 73. However, because of the reduced energy level of heavy hole valence band 75, the holes are predominantly light holes. The overall effect is one of decreased effective mass of the valence bands. This decreases the charges required to create a population inversion, and thus a reduction in the transparency current.

Strained quantum well devices of this type also have an increase in the differential gain, or, in the linear approximation, the gain coefficient. This effect decreases the spectral linewidth and increases the modulation bandwidth of the laser. Strained layer devices of this type may also increase the light emission efficiency of light emitting diodes (LED's). Because the strained cladding layers 47 and 49 in FIG. 2 induce strain into the light emitting layer 45, the strain can cause a normally indirect bandgap active region such as $Ga_{0.5}Al_{0.5}As$ to have a direct gap and thereby emit light efficiently. An efficiency gain is also expected for direct gap LED's in the same manner as achieved for lasers. Note that for surface emitting LED's, metallization layers 42 or 43 must be patterned to allow efficient light transmission. Other design optimizations that are known in the LED art may also be incorporated.

In FIGS. 1 and 2, strain can also be introduced into the active region quantum wells by using a lattice mismatched composition for the active region barrier layers, such as by introducing indium or phosphorus into the barrier layer material. For example, the active region 29 or 45 could be made up of four 12 nm thick quantum wells of $Ga_{0.95}Al_{0.05}As$ separated by three 6 nm thick barrier layers of $In_{0.10}Ga_{0.55}Al_{0.35}As$. The barrier layers could also be composed of $GaAs_{0.8}P_{0.2}$. $Ga_{0.9}Al_{0.1}As_{0.9}P_{0.1}$ barrier layers could also be used. If strained barrier layers are used, strained cladding layers 47 and 49 need not be present. Strain layers 47 and 49 in FIG. 2 would typically have about the same composition as the barrier layers, although this is not essential.

The strain in the active region 45 can also be varied laterally across the laser, by laterally altering the composition of strain layers 47 and 49 in a periodic manner, such as by changing the concentration of indium or phosphorus in an InGaAlAsP strain layer. This patterning would create regions that have higher differential gain than other regions, such that the active region has multiple laser emitters spaced apart in a monolithic linear array. Strain can also be varied laterally by etching away portions of the strain layers 47 and 49. Thus, instead of having strain layers that extend the width of the heterostructure 41, there would be multiple laterally spaced apart strain layers bounding each side of the active region. This is, of course, equivalent to periodically varying the indium or phosphorus content between a maximum value and zero.

The semiconductor lasers with incorporated lattice mismatched strain layers described herein have increased gain and other performance features over previous semiconductor lasers. Further, the lasers have a reduced degradation rate, resulting in longer lifetimes.

We claim:

1. In a semiconductor laser, a structure comprising, a substrate, and
a multilayer semiconductor heterostructure disposed on said substrate, said heterostructure including an active region of at least one layer, at least one cladding layer of said heterostructure having a composition with a substantially different lattice constant than said active region.

2. The structure of claim 1 wherein said substrate is composed of material selected from the group consisting of GaAs, InP, GaP, GaAlAs, GaAsP, GaSb, InSb, InGaAsP and GaAlAsP.

3. The structure of claim 1 wherein said active region includes at least one quantum well layer composed of material selected from the group consisting of GaAs, InGaAs, InGaAsP and InP.

4. The structure of claim 1 wherein said at least one cladding layer contain phosphorus.

5. The structure of claim 1 wherein said cladding layer has a linearly graded composition.

6. The structure of claim 1 wherein said cladding layer has a nonuniform composition.

7. The structure of claim 1 wherein said heterostructure includes a thin strain layer formed in said cladding layer containing a concentration of phosphorus greater than 2%, whereby a lattice mismatch with said cladding layer of at least 0.2 percent is produced.

8. The structure of claim 7 wherein said thin strain layer is positioned sufficiently close to said active region so as to induce a strain in said active region, thereby altering the bandgap.

9. The structure of claim 1 wherein said active region is bounded by adjacent $Al_{1-y}Ga_yAs_{1-z}P_z$ strain layers, where $z \geq 0.02$ and $0 \leq y \leq 1$, whereby strain is placed on said active region so as to increase gain.

10. The structure of claim 1 wherein said active region consists of multiple quantum wells separated by at least one barrier layer having a different lattice constant than said quantum wells.

11. In a semiconductor laser, a structure comprising:
a substrate, and
a multilayer semiconductor heterostructure disposed on said substrate, said heterostructure including an active region, cladding layers above and below said active region and at least one strain layer in one of said cladding layers, said active region and said cladding layers having lattice constants that substantially match one another, said strain layer having a lattice constant that differs from the lattice constant of said one of said cladding layers by at least 0.2% but not more than 4%, whereby a localized strain field is produced from lattice distortion at said strain layer, said strain layer having a thickness which is less than a critical thickness for dislocation generation.

12. The structure of claim 11 wherein said strain layer has a thickness on the order of 10 nm.

13. The structure of claim 11 wherein said strain layer is composed of InGaAlAsP in a GaAlAs cladding layer, said strain layer having a phosphorus content selected to provide said lattice constant difference.

14. The structure of claim 13 wherein said strain layer is composed of $GaAs_{1-z}P_z$, where $z \geq 0.02$.

15. The structure of claim 11 wherein said strain layer is disposed adjacent to said active region.

16. The structure of claim 11 wherein said strain layer is disposed spaced away from said active region but proximate thereto, whereby said localized strain field is introduced into said active region.

17. The structure of claim 11 wherein said strain layer is disposed in said cladding layer below said active region.

18. The structure of claim 11 wherein a pair of strain layers is disposed in cladding layers both above and below said active region.

19. The structure of claim 18 wherein said pair of strain layers bound said active region and are disposed adjacent to said active region.

20. The structure of claim 11 wherein said active region consists of multiple quantum wells separated by lattice mismatched barrier layers.

21. In a semiconductor laser, a structure comprising, a substrate, and
a multilayer semiconductor heterostructure disposed on said substrate, said heterostructure including an active region with at least one quantum well layer, and strain layers bounding said active region, said strain layers having a lattice constant that differs from said active region layers by at least 0.2%, each of said strain layers having a thickness which is less than a critical thickness for dislocation generation.

22. The structure of claim 21 wherein said strain layers contain phosphorus.

23. The structure of claim 21 wherein said active region has multiple quantum wells.

24. The structure of claim 21 wherein each of said strain layers extends across the width of said heterostructure.

25. The structure of claim 21 wherein said strain layers have a composition which varies laterally in a periodic manner, whereby said lattice constant of said strain layers also varies laterally across said heterostructure in a periodic manner, said active region thereby having multiple laser emitters.

26. The structure of claim 21 wherein there are multiple laterally spaced apart strain layers bounding each side of said active region, whereby said active region has multiple laser emitters.

27. The structure of claim 21 wherein the active region consists of multiple quantum wells separated by lattice mismatched barrier regions.

28. The structure of claim 21 wherein barrier layers of said active region between multiple quantum wells of said active region contain phosphorus.

29. In a light emitting device, a structure comprising, a substrate, and
a multilayer semiconductor heterostructure disposed on said substrate, said heterostructure including a light emitting region of at least one layer, at least one cladding layer of said heterostructure including a thin strained layer with a composition of a substantially different lattice constant than said active region.

30. The structure of claim 29 wherein said substrate is composed of material selected from the group consisting of GaAs, InP, GaP, GaAlAs, GaAsP, GaSb, InSb, InGaAsP and GaAlAsP.

31. The structure of claim 29 wherein said active region includes at least one quantum well layer composed of material selected from the group consisting of GaAs, InGaAs, InGaAsP and InP.

32. The structure of claim 29 wherein said at least one cladding layer contain phosphorus.

33. The structure of claim 29 wherein said thin strained layer formed in said cladding layer contains a concentration of phosphorus greater than 2%, whereby a lattice mismatch with said cladding layer of at least 0.2 percent is produced.

34. The structure of claim 29 wherein said strained layer is positioned sufficiently close to said light emitting region so as to partially strain said light emitting region.

35. The structure of claim 29 wherein said active region is bounded by adjacent $GaAs_{1-z}P_z$ strain layers, where $z \geq 0.02$, whereby strain is placed on said active region so as to increase gain.

36. The structure of claim 29 wherein said cladding layer has a nonuniform composition.

37. The structure of claim 29 wherein said light emitting region consists of multiple quantum wells separated by strained barrier layers.

* * * * *

UNITED STATES PATENT AND TRADEMARK OFFICE
CERTIFICATE OF CORRECTION

PATENT NO. : 5,048,036

DATED : September 10, 1991

INVENTOR(S) : Donald R. Scifres et al.

It is certified that error appears in the above-identified patent and that said Letters Patent is hereby corrected as shown below:

Column 4, line 30, "0.1(6.05858 Å) + (0.4)(5.66315 Å)" should read -- (0.1)(6.05838 Å) + (0.4)(5.65315 Å) --; line 51, "(0.02)(5.8675 Å)" should read -- (0.02)(5.86875 Å) --.

Column 6, line 12, "$In_uAl_wGa_{1-u-w}As$" should read -- $In_uAl_wGa_{1-u-w}As$ --.

Claim 9, column 8, line 28, "$Al_{1-y}Gs_yAs_{1-z}P_z$" should read -- $Al_{1-y}Ga_yAs_{1-z}P_z$ --.

Signed and Sealed this

Twelfth Day of January, 1993

Attest:

DOUGLAS B. COMER

Attesting Officer

Acting Commissioner of Patents and Trademarks